(12) United States Patent
Yang et al.

(10) Patent No.: US 9,209,340 B2
(45) Date of Patent: Dec. 8, 2015

(54) POLARIZING PHOTOVOLTAIC DEVICES AND APPLICATIONS IN LCD DISPLAYS AND TANDEM SOLAR CELLS

(75) Inventors: Yang Yang, Los Angeles, CA (US); Rui Zhu, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 224 days.

(21) Appl. No.: 14/110,881

(22) PCT Filed: Apr. 11, 2012

(86) PCT No.: PCT/US2012/033133
§ 371 (c)(1),
(2), (4) Date: Oct. 9, 2013

(87) PCT Pub. No.: WO2012/142168
PCT Pub. Date: Oct. 18, 2012

(65) Prior Publication Data
US 2014/0028957 A1    Jan. 30, 2014

Related U.S. Application Data

(60) Provisional application No. 61/474,074, filed on Apr. 11, 2011.

(51) Int. Cl.
*G02F 1/1335* (2006.01)
*H01L 31/18* (2006.01)
(Continued)

(52) U.S. Cl.
CPC ............. *H01L 31/18* (2013.01); *B82Y 10/00* (2013.01); *G02F 1/133528* (2013.01);
(Continued)

(58) Field of Classification Search
CPC . H01L 51/0012; H01L 51/42; H01L 51/4253; H91L 31/18; B82Y 10/00; G02F 1/133528
See application file for complete search history.

(56) References Cited

U.S. PATENT DOCUMENTS 6,649,283 B1 *  11/2003  Lupo et al. ............... 428/690
6,878,871 B2 *  4/2005   Scher et al. .............. 136/252
(Continued)

FOREIGN PATENT DOCUMENTS

KR    10-2010-0049792 A    5/2010

OTHER PUBLICATIONS

International Search Report and Written Opinion of PCT/US2012/033133.
(Continued)

*Primary Examiner* — James Dudek
(74) *Attorney, Agent, or Firm* — Venable LLP; Henry J. Daley

(57) ABSTRACT

An electro-optic device includes a first electrode, a second electrode spaced apart from the first electrode, and an active layer of organic semiconducting material between the first electrode and the second electrode. The active layer includes a quasi-bilayer in which a first plurality molecules from a first layer of active material is interpenetrated by a second plurality of molecules from a second layer of active material formed on the first layer. The first and second pluralities of molecules provide donor-acceptor pairs such that the quasi-bilayer has at least a portion that is a bulk heterojunction active layer. Each of the first plurality of molecules has a long axis that is longer than corresponding transverse axes and the long axis is substantially aligned along a common direction such that the active layer is more sensitive to a first polarization of incident light than a second polarization of the incident light, wherein the first polarization and the second polarization are orthogonal polarization components of the light.

21 Claims, 13 Drawing Sheets

(51) Int. Cl.
  *H01L 51/42* (2006.01)
  *H01L 51/00* (2006.01)
  *B82Y 10/00* (2011.01)
  *G02B 5/30* (2006.01)
  *G02F 1/133* (2006.01)
  *H01L 27/30* (2006.01)

(52) U.S. Cl.
  CPC ........... *H01L 51/0012* (2013.01); *H01L 51/42* (2013.01); *H01L 51/4253* (2013.01); *G02B 5/3025* (2013.01); *G02F 2001/13324* (2013.01); *H01L 27/302* (2013.01); *H01L 51/0036* (2013.01); *H01L 51/0047* (2013.01); *Y02E 10/549* (2013.01)

(56) References Cited

U.S. PATENT DOCUMENTS

| | | | |
|---|---|---|---|
| 2004/0067324 A1* | 4/2004 | Lazarev et al. | 428/1.31 |
| 2009/0255586 A1 | 10/2009 | Kim et al. | |
| 2009/0266418 A1* | 10/2009 | Hu et al. | 136/260 |
| 2010/0224236 A1 | 9/2010 | Reilly, III et al. | |
| 2010/0276731 A1 | 11/2010 | Nam et al. | |
| 2011/0096271 A1* | 4/2011 | Yoshida et al. | 349/96 |
| 2011/0109853 A1* | 5/2011 | Ge et al. | 349/114 |

OTHER PUBLICATIONS

Anthopoulos et al., Air-stable n-channel organic transistors based on a soluble C-84 fuilerene derivative. Advanced Materials, 2006. 18(13): p. 1679-.

Becerril et al., High-performance organic thin-film transistors through solution-sheared deposition of small-molecule organic semiconductors. Advanced Materials, 2008.20(13);: p. 2588-.

Bolognesi et al., Polarized photoluminescence and electroluminescence in oriented films of regioregular poly(3-alkylthiophenes). Organic Electronics, 2000. 1(1): p. 27-32.

Brinkmann, Directional epitaxial crystallization and tentative crystal structure of poly (9,9'-din-octyl-2,7-fluorene). Macromolecules, 2007.40(21): p. 7532-7541.

Brinkmann et al., Fabrication of oriented and periodic hybrid nano. structures of regioregular poly(3-hexylthlophene) and CdSe nanocrystais by directional epitaxial solidification. Advanced Materials, 2007. 19(22): p. 3819-.

Chen et al., Polarized electrolorninescence from aligned chromophores bg the friction transfer method, Advanced Materials, 2000.12(5): p. 344-.

Cheng et al., Self-assembly of metallic nanowires from aqueous solution. Nano Letters, 2005.5(1): p. 175-178.

Cheun et al., Polarized optical absorption spectroscopy, NEXAFS, and GIXRD measurements of chain alignment in polyfluorene thin films. Macromolecules, 2008. 41(17): p. 6463-6472.

Dickey et al., Improving organic thin-film transistor performance through solvent-vapor annealing of solution-processable triethylsilylethynyl anthradithiophene. Advanced Materials, 2006. 18(13): p. 1721-.

Fujiwara et al., Solution deposited liquid crystalline semiconductors on a photoalignment layer for organic thin-film transistors. Applied Physics Letters, 2007. 90(23): p. 232108.

Jimison et al., Charge-Transport Anisotropy Due to Grain Boundaries in Directionally Crystallized Thin Films of Regioregular Poly(3-hexylthiophene). Advanced Materials, 2009. 21(16): p. 1568-.

Lee et al., Solution-processable pentocene microcrystal arrays for high performance organic field-effect transistors. Applied Physics Letters, 2007. 90(13).

Li et al., High-efficiency solution processable polymer photovoltaic cells by self-organization of polymer blends. Nature Materials, 2005. 4(11): p. 864-868.

Liu et al.,, In-situ regrowth and purification by zone melting of organic single-crystal thin films yielding significantly enhanced optoelectronic properties. Chemistry of Materials, 2000. 12(8): p. 2353-2362.

Liu et al., Controlled Deposition of Crystalline Organic Semiconductors for Field-Effect-Transistor Applications. Advanced Materials, 2009. 21(12): p. 1217-1232.

Luzzati et al., Polarization properties of a novel oriented polydiacetylene, in Synthetic Metals. 1998. p. 47-52.

Misaki, et al., Polymer-supported anisotropic submicrometer-patterned electrodes for displays. Advanced Materials, 2005. 17(3): p. 297-.

Nagamatsu et al., Backbone arrangement in friction-transferred regioregular poly(3-alkylthiophene)s. Macromolecules, 2003. 36(14): p. 5252-5257.

Pisula et al., A zone-casting technique for device fabrication of field-effect transistors based on discotic hexa-peri-hexabenzoeoronene. Advanced Materials, 2005. 17(6): p. 684-.

Schilinsky et al., Performance analysis of printed bulk heterojunction solar cells. Advanced Functional Materials, 2006. 16(13): p. 1669-1672.

Shkiyarevskiy et al., High anisotropy of the field-effect transistor mobility in magnetically aligned discotic liquid-crystalline semiconductors. Journal of the American Chemical Society, 2005, 127(46):11, 16233-16237.

Sirringhaus, et al., Mobility enhancement in conjugated polymer field-effect transistors through chain alignment in a liquid-crystalline phase. Applied Physics Letters, 2000. 77(3): p. 406-408.

Stingelin-Stutzmann, N., et al., Organic thin-film electronics from vitreous solution-processed rubrene hypereutectics. Nature Materials, 200504(8): p. 4601-4606, 2008.

Xu et al., Langmuir-Blodgett films of regioregular poly(3-hexylthiophene) as field-effect transistors. Langmuir, 2000. 16(4): p. 1834-1841.

Yoo et al., High-performance solution-deposited n-channel organic transistors and their complementary circuits. Advanced Materials, 2007. 19(22): p. 4028-.

Zheng, et al., Uniaxiai alignment of liquid-crystalline conjugated polymers by nonoconfinement. Nano Letters, 2007, 7(4): p. 987-992.

* cited by examiner

1. ITO glass coated with PEDOT:PSS;

2. Drop the P3HT:PCBM solution onto the substrate;

3. Cover the droplet by a top substrate;

4. Fix the bottom substrate, and shear the top substrate with certain speed.

Shearing direction

Polymer chain orientation

YYlabs, UCLA

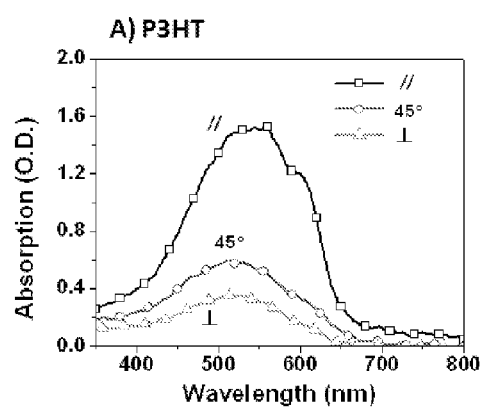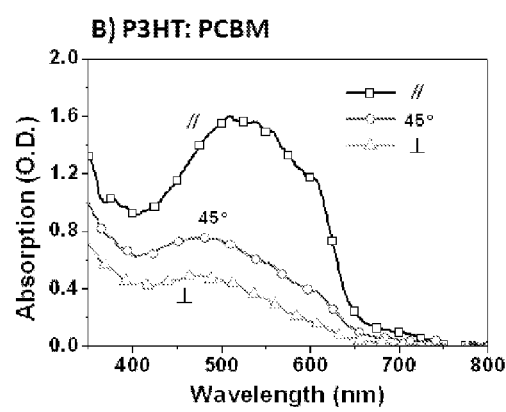
FIG. 8A                     FIG. 8B

POLARIZING PHOTOVOLTAIC DEVICES AND APPLICATIONS IN LCD DISPLAYS AND TANDEM SOLAR CELLS

CROSS-REFERENCE OF RELATED APPLICATION

This is a national stage application under 35 U.S.C. §371 of PCT/US2012/033133 filed Apr. 11, 2012, the entire contents of which are incorporated herein by reference and this application claims priority to U.S. Provisional Application No. 61/474,074 filed Apr. 11, 2011, the entire contents of which are hereby incorporated by reference.

This invention was made with government support under N00014-04-1-0434 awarded by the United States Navy, Office of Naval Research. The government has certain rights in the invention.

BACKGROUND

1. Field of Invention

The field of the currently claimed embodiments of this invention relates to electro-optic devices, and more particularly to polarizing photovoltaic components and devices that incorporate the components.

2. Discussion of Related Art

Liquid crystal display (LCD) technology is currently the most popular information display technology. Its uses include monitors for computers, laptops, televisions, instrument panels, projectors, and other electronic devices ranging from aircraft cockpit displays to every-day consumer electronic devices.

Generally, each pixel of the LCD consists of four basic components: backlight units, back polarizing filter, a layer of aligned liquid crystal molecules between two transparent electrodes, and front polarizing filter. FIG. 1 shows the basic construction of a pixel in an LCD display. The isotropic backlight can be divided into two linear oscillation components: the parallel (//) and perpendicular (+) polarizations. Usually, a polarizer is formed by stretching a linear long-chain organic (or polymeric) molecule into a uniaxial orientation. When unpolarized light (with both // and + polarizations) falls on the polarizer, the stretched molecules absorb photons with electric field oscillation parallel to the stretch direction. This is defined as the parallel polarization. When the light reaches the back polarizing film, the // polarization (with respect to the back film) is absorbed, and only the perpendicularly polarized light can pass through the polarizer. The orientation of the front and back polarizer is perpendicular to completely cross-out the light to provide a dark background of the display. Without a liquid crystal molecular layer between the polarizing filters, light passing through the back polarizing filter would be blocked by the front one. The electric field-driven liquid crystal molecular layer acts as a light modulator to reorient the direction of the incident linear polarized light. Before applying an electric field, the liquid crystal molecules arrange themselves in a helical or twist structure. This rotates the axis of the incident linear polarized light making it perpendicular to the stretching direction of the front film. Hence, some portion of the light can pass thought the front polarizing film resulting in a grey pixel. After applying an electric field, the liquid crystal molecules are almost completely untwisted and the polarization direction of the linear polarized incident light is not rotated as it passes through the liquid crystal layer. This light will then be blocked by the front filter, resulting in a black pixel. By modulating the bias applied on the liquid crystal layer, the portion of light passed can be varied, which constitutes different levels of gray.

From the energy point of view, LCD technology is very inefficient. The power consumption of the backlight unit is the largest portion of the total power consumption in an LCD. To add to it, more than 90% of light energy from the backlight unit is absorbed by the two orthogonal polarizing filters. That is a great waste of energy, especially when the pixel is black since the LCD's backlight is always on so the light energy for a black pixel is 100% wasted. There thus remains a need for improved polarizers and devices that incorporate the improved polarizers.

SUMMARY

An electro-optic device according to an embodiment of the current invention includes a first electrode, a second electrode spaced apart from the first electrode, and an active layer of organic semiconducting material between the first electrode and the second electrode. The active layer includes a quasi-bilayer in which a first plurality molecules from a first layer of active material is interpenetrated by a second plurality of molecules from a second layer of active material formed on the first layer. The first and second pluralities of molecules provide donor-acceptor pairs such that the quasi-bilayer has at least a portion that is a bulk heterojunction active layer. Each of the first plurality of molecules has a long axis that is longer than corresponding transverse axes and the long axis is substantially aligned along a common direction such that the active layer is more sensitive to a first polarization of incident light than a second polarization of the incident light, wherein the first polarization and the second polarization are orthogonal polarization components of the light.

A method of producing a polarization-sensitive photovoltaic device according to an embodiment of the current invention includes forming a layer of first active material on a substructure in which the substructure includes a first electrode. The first active material includes a first plurality of molecules each having a long axis that is longer than corresponding transverse axes. The method also includes aligning the long axes of the first plurality of molecules substantially along a common direction; forming a layer of a second active material on the layer of the first active material after the aligning, the second active material including a second plurality of molecules; forming a quasi-bilayer from the layers of said first and second active materials such that the second plurality of molecules interpenetrate the layer of the first active material, the first and second pluralities of molecules providing donor-acceptor pairs such that the quasi-bilayer has at least a portion that is a bulk heterojunction active layer; and forming a second electrode in electrical connection with the quasi-bilayer.

A liquid crystal display according to an embodiment of the current invention includes a first polarizer; a second polarizer spaced apart from the first polarizer; and an electrically controllable liquid crystal element arranged between the first and the second polarizers. The first and second polarizers are arranged in a substantially cross-polarized orientation with respect to each other, and at least one of the first and second polarizers is a photovoltaic polarizer that is more sensitive to a first polarization of incident light than a second polarization of the incident light.

BRIEF DESCRIPTION OF THE DRAWINGS

Further objectives and advantages will become apparent from a consideration of the description, drawings, and examples.

FIGS. 8A-8B show anisotropic absorption spectra of P3HT (A) and P3HT:PCBM (B) films for incident light polarization parallel (squares), perpendicular (triangles) and at 45° (circles) to the P3HT chain orientation according to an embodiment of the current invention.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

Figure 2:
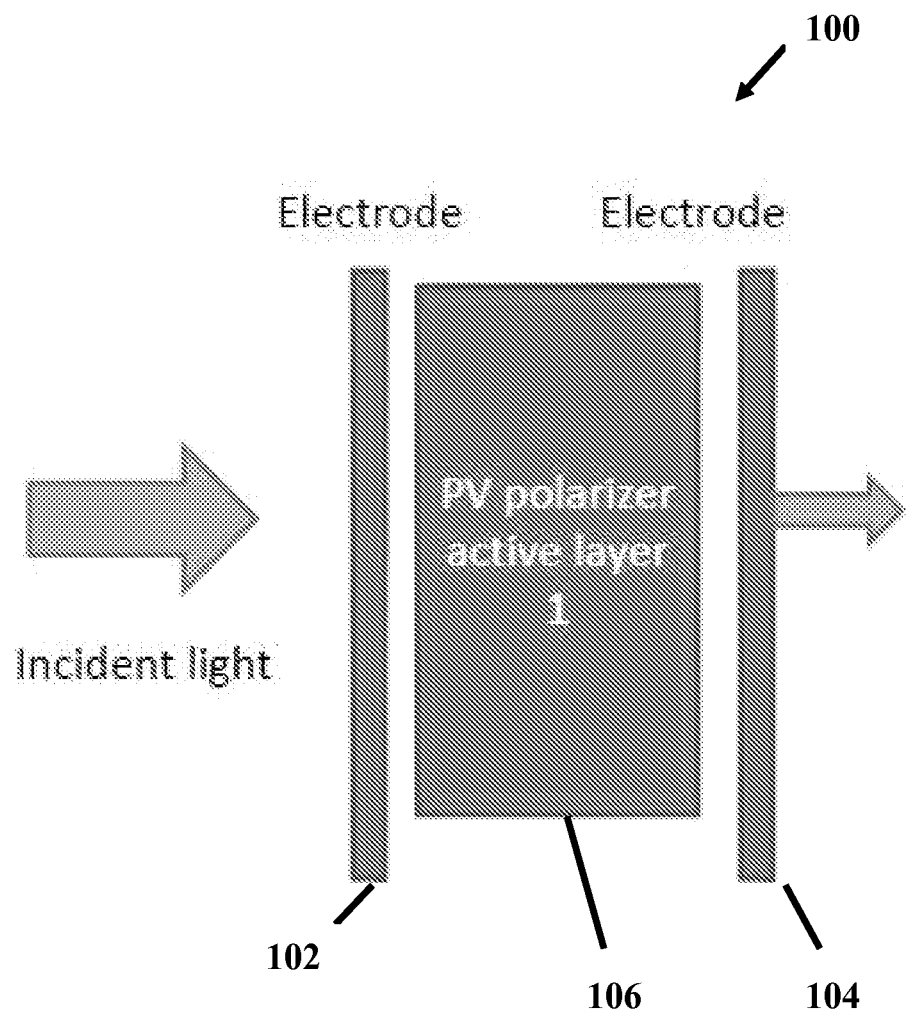
FIG. 2 is a schematic illustration of electro-optic device according to an embodiment of the current invention.

FIG. 2 is a schematic illustration of an electro-optic device 100 according to an embodiment of the current invention. The electro-optic device 100 has a first electrode 102, a second electrode 104 spaced apart from the first electrode 102, and an active layer 106 of organic semiconducting material between the first electrode 102 and the second electrode 104. The active layer 106 includes a quasi-bilayer which will be described in more detail below. The quasi-bilayer has a first plurality of molecules from a first layer of active material that is interpenetrated by a second plurality of molecules from a second layer of active material that is formed on the first layer. The first and second pluralities of molecules provide donor-acceptor pairs such that the quasi-bilayer has at least a portion that is a bulk heterojunction active layer. Each of the first plurality of molecules has a long axis that is longer than corresponding transverse axes and the long axis is substantially aligned along a common direction such that the active layer is more sensitive to a first polarization of incident light than a second polarization of the incident light, said first polarization and said second polarization being orthogonal polarization components of said light.

As will be described in more detail below, the "quasi-bilayer" is produced by first forming a layer of material that includes the first plurality of molecules. The first plurality of molecules can be either donor or acceptor organic semiconducting molecules as long as they have one dimension that is longer than the orthogonal transverse dimensions. The organic semiconducting molecules can be small molecules and/or polymers, for example. Before the second layer of material is formed on the first layer, the first plurality of molecules is at least partially aligned along a common direction. After forming the layer of material that includes the second plurality of molecules on the first layer, an annealing or similar process is performed such that the second plurality of molecules interpenetrate the first layer. The resulting quasi-bilayer is similar or equivalent to a bulk heterojunction organic semiconductor that has well aligned anisotropic molecules. The inventors found that first forming a blend of donor and acceptor materials, prior to aligning anisotropic molecules, hindered alignment of the anisotropic materials. The quasi-bilayer can be partially or totally interpenetrated. It is thus effectively a bulk heterojunction layer, but with good alignment of the anisotropic molecules.

In some embodiments of the current invention, the active layer 106 is more sensitive to the first polarization than the second polarization of the incident light by a ratio of at least 6. The first and second polarizations can be orthogonal linear polarization components of the incident light, for example. In further embodiments of the current invention, the active layer 106 is more sensitive to the first polarization than the second polarization of the incident light by a ratio of at least 10. In additional embodiments of the current invention, the active layer 106 is more sensitive to the first polarization than the second polarization of the incident light by a ratio of at least 14.

At least one of the first and second electrodes (102, 104) can be substantially transparent at an operating wavelength according to an embodiment of the current invention. The first electrode 102 and the second electrode 104 can be either in direct electrical contact with the active layer 106, or there can be one of more layers of material between either one, or both, of the electrodes and the active layer. For example, a buffer layer can be included between one of the electrodes 102, 104 and the active layer 106. The electrodes 102 and 104 can be a single layer, or multiple layers of materials, for example.

The electro-optic device 100 can be an inverted photovoltaic polarizer, or a non-inverted photovoltaic polarizer according to some embodiments of the current invention. For example, the electro-optic device 100 can include a transparent substrate upon which the first electrode is formed, and a buffer layer of n-type material is formed on the first electrode. In this case, the first layer of the quasi-bilayer is a p-type polymer donor material formed on the buffer layer such that said electro-optic device is an inverted photovoltaic polarizer. In another example, the electro-optic device 100 can include a transparent substrate upon which the first electrode is formed, and a buffer layer of p-type material is formed on the first electrode. In this case, the first layer of the quasi-bilayer is an n-type polymer donor material formed on the buffer layer. The electro-optic device 100 is not limited to these particular embodiments.

Figure 3:
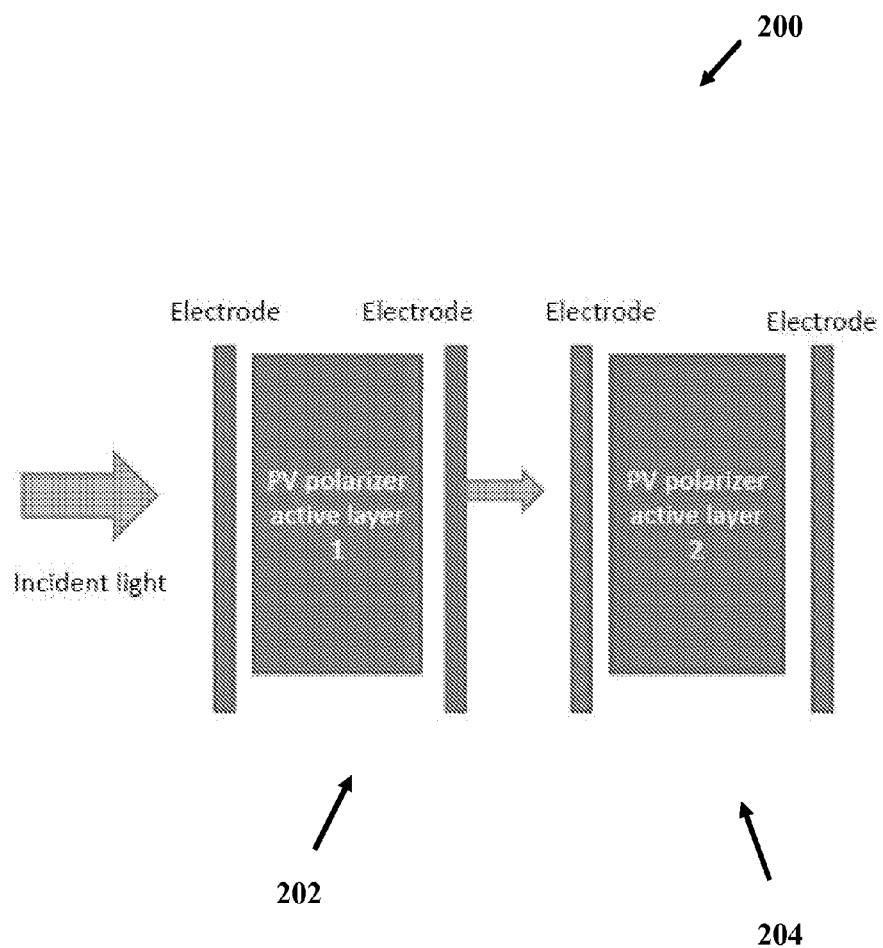
FIG. 3 is a schematic illustration of electro-optic device according to another embodiment of the current invention.

FIG. 3 is a schematic illustration of an electro-optic device 200 according to another embodiment of the current invention. In this embodiment, two photovoltaic polarizers 202 and 204 are electrically connected such that the electro-optic device 200 is a tandem photovoltaic polarizer. In some embodiments, the polarization orientation of photovoltaic polarizer 202 can be substantially orthogonal to the polarization orientation of photovoltaic polarizer 204. Each of the photovoltaic polarizers 202 and 204 can be similar to, or substantially the same as, the photovoltaic polarizer 100, for example.

Figure 4:
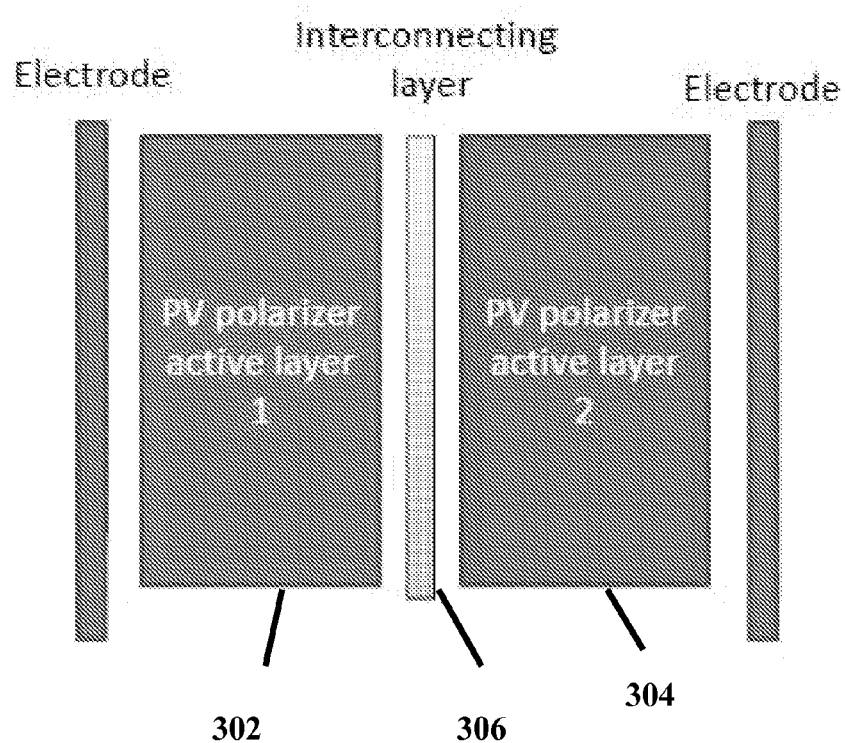
FIG. 4 is a schematic illustration of electro-optic device according to another embodiment of the current invention.

FIG. 4 is a schematic illustration of an electro-optic device 300 according to another embodiment of the current invention. In this embodiment, two photovoltaic polarizer active layers 302 and 304 are formed into an integrated device with an interconnecting layer therebetween. The photovoltaic polarizer active layers 302 and 304 can be arranged in a substantially cross polarized configuration with respect to each other in some embodiments.

The following examples are provided to help explain further concepts and details of some embodiments of the current invention. Some particular applications are also described. However, the general concepts of the current invention are not limited to the particular applications and examples.

EXAMPLE 1

Figure 5:
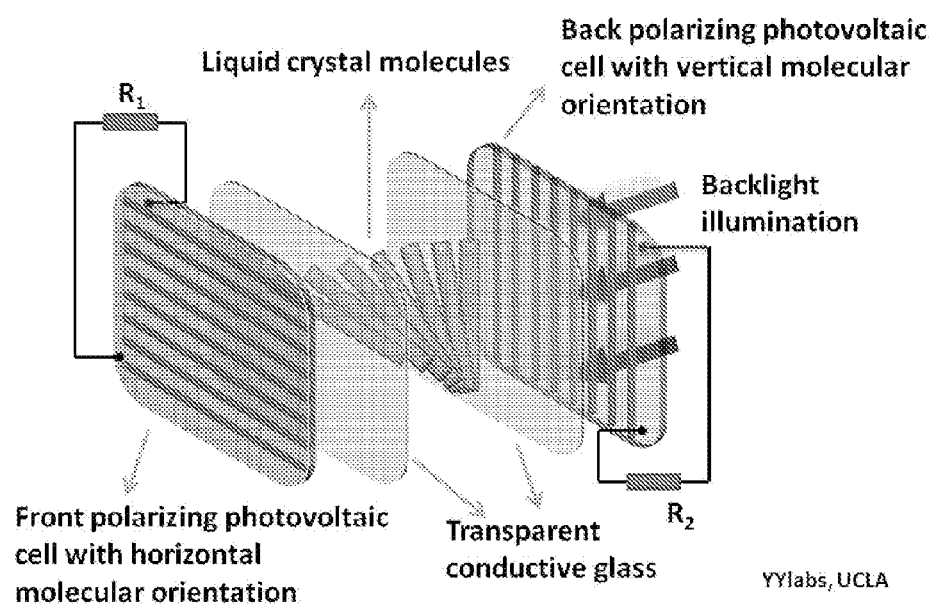
FIG. 5 is a schematic illustration of an LCD display according to an embodiment of the current invention.
Figure 6:
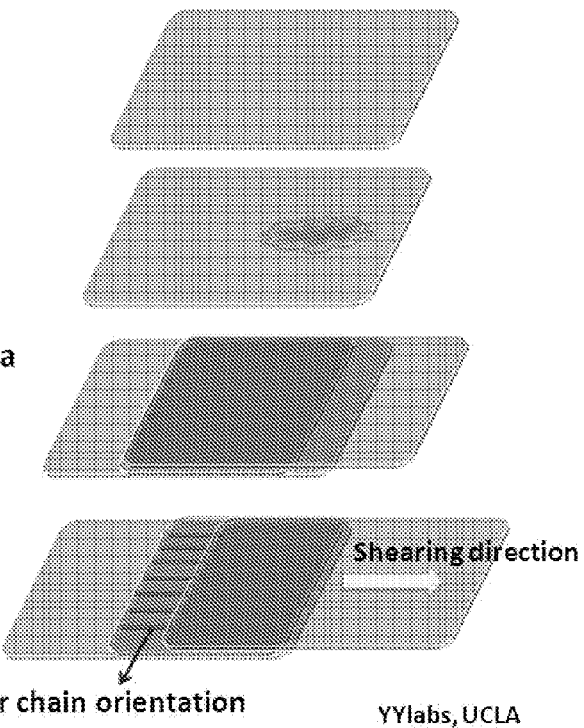
FIG. 6 is a schematic illustration of a modified solution-shearing process for the preparation of polarizing conjugated films according to an embodiment of the current invention.

To solve the problem of energy waste in conventional LCDs, as mentioned in the Background, we present here the use of polarizing photovoltaic cells for recycling energy from the backlight. Traditional polarizing filters in LCD systems can be replaced by the polarizing photovoltaic cells, as is illustrated schematically in FIG. 5. The polarizing photovoltaic cells not only act as polarizing films to provide linearly polarized light, but instead of simply blocking the light, they absorb it and convert it into usable power which can be fed back into the system, hence increasing the overall efficiency of the system as a whole. FIG. 5 shows an example of LCD system according to an embodiment of the current invention that includes polarizing photovoltaic cells. When the isotropic light reaches the first polarizing photovoltaic film, the light portion with axis parallel to the molecular orientation of the first polarizing photovoltaic film will be absorbed. This portion of light energy will be collected and transferred into electric energy via the photovoltaic device. However, the light with the axis perpendicular to the molecular orientation of the polarizing photovoltaic film can still pass through the film with little loss. Similarly, when the polarized light reaches the front polarizing photovoltaic film, the absorbed portion of the incident polarized light can also turn into electricity via the front photovoltaic cell.

Polarizing photovoltaic devices according to some embodiments of the current invention can include, but are not limited to, conjugated polymer bulk-heterojunction (BHJ) photovoltaic devices. The BHJ photovoltaic devices can have advantages of light weight, thin film thickness, ease of morphology control and solution-processability.[1] The polarizing polymer BHJ films can be achieved by many methods, which involve the alignment of polymer chains in the film. Such alignment can be produced by any one or combination of methods involving stretching[2], friction transfer[3], shearing[4], directed crystallization[5], dip-coating[6], zone-casting[7], mechanical rubbing[8], liquid crystalline self-organization[9], or Langmuir-Blodgett (LB) technique[10], roll-to-roll deposition[5], solvent vapor annealing[11], film re-crystallization techniques[12], zone refining[13], printing using dedicated pneumatic microinjection systems[14], doctor-blade[15], epitaxial solidification/growth[16], nano-imprinting[17], photoalignment techniques[18]. Such alignments can also be preferably induced by surface patterns[19], aligned templates[20], substrates[21], magnetic field[22], electric field[23], directional crystallization[24], use of vitrification agents to control crystallization[25] or drop-casting of the semiconductor solution on a tilted substrates[26].

FIG. 3 demonstrates an example of polarizing BHJ photovoltaic films based on the solution-shearing method. The ITO substrate is coated with a PEDOT:PSS layer. Then, the polarized BHJ polymer film is prepared on the substrate by a modified solution-shearing method. 1,3,5-trichlorobenzene is added into the polymer blend solution to direct the crystallization of a P3HT:PCBM blend film. With this method, aligned conjugated polymer films can be obtained with anisotropic and light polarizing properties. Finally, a back electrode is deposited onto the polarizing BHJ films to finish the polarizing photovoltaic devices.

Figures 7A, 7B:
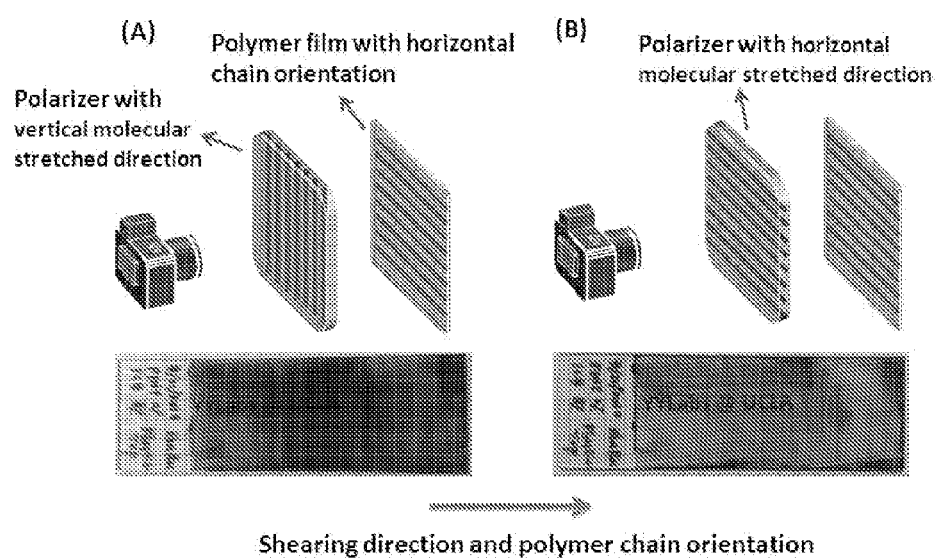
FIGS. 7A-7B show pictures of the polarizing P3HT film taken by digital camera as an example according to an embodiment of the current invention. Between the sample slide and the camera, there is a commercial polarizer (with known stretching direction of polymer). The stretching direction of polarizer is perpendicular (A) or parallel (B) to the direction of the P3HT chain orientation

FIGS. 7A and 7B show the polarizing poly(3-hexylthiophene) (P3HT) film prepared by the modified solution-shearing method. A commercial polarizer with known stretching direction is placed between the slide and the camera. When the stretch direction of the polarizer is perpendicular to polymer alignment of the polarizing P3HT film, the film appears dark in color and the words below the slide cannot be clearly seen (FIG. 8A). However, when the stretch direction of the polarizer and the P3HT chain orientation is parallel, the film shows semi-transparent color and the word "UCLA" is readable, indicating the transmission of the polarized light.

FIGS. 8A and 8B show the polarized absorption spectra for both polarizing P3HT (FIG. 8A) and P3HT: PCBM (FIG. 8B) films. In FIG. 8A, when the P3HT chain orientation is perpendicular to the polarized incident light, the optical density at 600 nm is 0.16. When the P3HT chain orientation is parallel to the polarized the incident light, the optical density at 600 nm is 1.21. The dichroic ratio is 7.6. The absorption shoulder around 600 nm is the $\pi$-$\pi$* transition of the stacked P3HT chains. This absorption shoulder is much more pronounced in the parallel configuration. In the FIG. 8B, the blend films also show significant anisotropic absorption and the dichroic ratio at 600 nm is 6.9. This indicates that the PCBM molecules won't affect the alignment of P3HT chains.

Figures 9A, 9B, 9C:
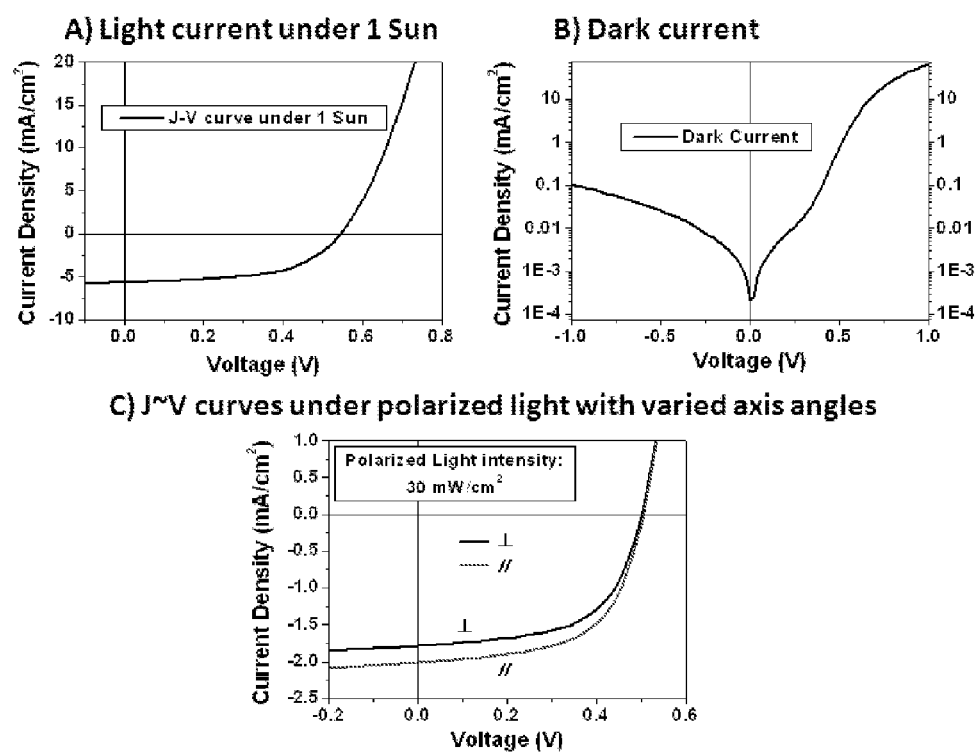
FIGS. 9A-9C show voltage-current density characterization of the polarizing photovoltaic cell according to an embodiment of the current invention. A) Light current under simulated AM1.5 G, 100 mW/cm$^2$ (1 Sun); B) Dark current; C) Light current under polarized light with different axis angles. The two curves correspond to P3HT chain orientation being parallel and perpendicular to the incident polarized light. The incident polarized light density is 30 mW/cm$^2$.

FIGS. 9A-9C present the voltage-current density characterization for the polarizing photovoltaic cell. Under simulated 100 mW/cm$^2$, the device has a power conversion efficiency of 1.68%, with an open-circuit voltage ($V_{oc}$) of 0.544 V, a short-circuit current ($J_{sc}$) of 5.64 mA/cm$^2$, and a fill factor (FF) of 54.8%. Then, the device is exposed to a polarized incident light with an intensity of 30 mW/cm$^2$. When the polymer chain orientation is parallel to the polarized incident light, a $J_{sc}$ of 2.01 mA/cm$^2$ will be obtained with a $V_{oc}$ of 0.505 V and FF of 59.0%, resulting in a total power conversion efficiency of 2.0%. When the polymer chain orientation is orthogonal to the polarized incident light, less incident polarized light will be captured. The $J_{sc}$ is 1.79 mA/cm$^2$ and reduced by 10%, with a $V_{oc}$ of 0.501 V, a FF of 58.7% and an overall efficiency of 1.77%. Such the reduction in $J_{sc}$ indicates the anisotropic light response to the polarized incident light.

In addition to LCDs, polarized OPV cells according to some embodiments of the current invention can also be applied to tandem solar cells. One problem with polymer solar cells is the low carrier mobility; hence one must make the active film thinner to compensate the low carrier mobility. However, this will reduce the absorption of photons. By coupling with two polarized OPV cells with two orthogonal orientations, photons can be absorbed more efficiently.

For either LCD's or tandem solar cells, transparent electrodes must be used. The transparent electrodes can be graphene, ITO, ZnO, Al-doped ZnO, thin metallic films, such as gold or silver, or metal mesh, for example.

References

1. Li, G., et al., *High-efficiency solution processable polymer photovoltaic cells by self-organization of polymer blends.* Nature Materials, 2005. 4(11): p. 864-868.
2. Luzzati, S., et al., *Polarization properties of a novel oriented polydiacetylene, in Synthetic Metals.* 1998. p. 47-52.
3. Nagamatsu, S., et al., *Backbone arrangement in "friction-transferred" regioregular poly(3-alkylthiophene)s.* Macromolecules, 2003. 36(14): p. 5252-5257.
4. Becerril, H. A., et al., *High-performance organic thin-film transistors through solution-sheared deposition of small-molecule organic semiconductors.* Advanced Materials, 2008. 20(13): p. 2588-.
5. Jimison, L. H., et al., *Charge-Transport Anisotropy Due to Grain Boundaries in Directionally Crystallized Thin Films of Regioregular Poly(3-hexylthiophene).* Advanced Materials, 2009. 21(16): p. 1568-.
6. Liu, S. H., et al., *Controlled Deposition of Crystalline Organic Semiconductors for Field-Effect-Transistor Applications.* Advanced Materials, 2009. 21(12): p. 1217-1232.
7. Pisula, W., et al., *A zone-casting technique for device fabrication of field-effect transistors based on discotic hexa-peri-hexabenzoeoronene.* Advanced Materials, 2005. 17(6): p. 684-.
8. Bolognesi, A., et al., *Polarized photoluminescence and electroluminescence in oriented films of regioregular poly (3-alkylthiophenes).* Organic Electronics, 2000. 1(1): p. 27-32.
9. Sirringhaus, H., et al., *Mobility enhancement in conjugated polymer field-effect transistors through chain alignment in a liquid-crystalline phase.* Applied Physics Letters, 2000. 77(3): p. 406-408.
10. Xu, G. F., Z. A. Bao, and J. T. Groves, *Langmuir-Blodgett films of regioregular poly(3-hexylthiophene) as field-effect transistors.* Langmuir, 2000. 16(4): p. 1834-1841.
11. Dickey, K. C., J. E. Anthony, and Y. L. Loo, *Improving organic thin-film transistor performance through solvent-vapor annealing of solution-processable triethylsilylethynyl anthradithiophene.* Advanced Materials, 2006. 18(13): p. 1721-.
12. Anthopoulos, T. D., et al., *Air-stable n-channel organic transistors based on a soluble C-84 fullerene derivative.* Advanced Materials, 2006. 18(13): p. 1679-.
13. Liu, C. Y. and A. J. Bard, *In-situ regrowth and purification by zone melting of organic single-crystal thin films yielding significantly enhanced optoelectronic properties.* Chemistry of Materials, 2000. 12(8): p. 2353-2362.
14. Yoo, B., et al., *High-performance solution-deposited n-channel organic transistors and their complementary circuits.* Advanced Materials, 2007. 19(22): p. 4028-.
15. Schilinsky, P., C. Waldauf, and C. J. Brabec, *Performance analysis of printed bulk heterojunction solar cells.* Advanced Functional Materials, 2006. 16(13): p. 1669-1672.
16. Brinkmann, M., D. Aldakov, and F. Chandezon, *Fabrication of oriented and periodic hybrid nanostructures of regioregular poly(3-hexylthiophene) and CdSe nanocrystals by directional epitaxial solidification.* Advanced Materials, 2007. 19(22): p. 3819-.
17. Zheng, Z. J., et al., *Uniaxial alignment of liquid-crystalline conjugated polymers by nanoconfinement.* Nano Letters, 2007. 7(4): p. 987-992.
18. Fujiwara, T., J. Locklin, and Z. N. Bao, *Solution deposited liquid crystalline semiconductors on a photoalignment layer for organic thin-film transistors.* Applied Physics Letters, 2007. 90(23): p. 232108.
19. Misaki, M., et al., *Polymer-supported anisotropic submicrometer-patterned electrodes for displays.* Advanced Materials, 2005. 17(3): p. 297-.
20. Cheun, H., et al., Polarized optical absorption spectroscopy, NEXAFS, and GIXRD measurements of chain alignment in polyfluorene thin films. Macromolecules, 2008. 41(17): p. 6463-6472.
21. Chen, X. L., et al., *Polarized electroluminescence from aligned chromophores bg the friction transfer method.* Advanced Materials, 2000. 12(5): p. 344-.
22. Shklyarevskiy, I. O., et al., *High anisotropy of the field-effect transistor mobility in magnetically aligned discotic liquid-crystalline semiconductors.* Journal of the American Chemical Society, 2005. 127(46): p. 16233-16237.
23. Cheng, C. D., et al., *Self-assembly of metallic nanowires from aqueous solution.* Nano Letters, 2005. 5(1): p. 175-178.
24. Brinkmann, M., *Directional epitaxial crystallization and tentative crystal structure of poly(9,9'-di-n-octyl-2,7-fluorene).* Macromolecules, 2007. 40(21): p. 7532-7541.
25. Stingelin-Stutzmann, N., et al., *Organic thin-film electronics from vitreous solution-processed rubrene hypereutectics.* Nature Materials, 2005. 4(8): p. 601-606.
26. Lee, W. H., et al., *Solution-processable pentacene microcrystal arrays for high performance organic field-effect transistors.* Applied Physics Letters, 2007. 90(13).

EXAMPLE 2

The polarizing organic photovoltaic device will be referred to as ZOPV instead of POPV (polymer organic photovoltaic). Compared with their silicon or other inorganic or organic-inorganic hybrid counterparts, a unique advantage of organic conjugated materials is that the molecular chains can be easily oriented, leading to anisotropic response to polarized incident light. This feature can make the organic PV system superior to the inorganic PV system for PV polarizer purposes. ZOPV devices integrated into an LCD panel (FIGS. 10A, 10B) can have three potential benefits: 1) polarization, whereby the EM wave component with an electric field perpendicular to the oriented molecular chain (s-mode polarized light) propagates through the film without absorption, serving its conventional role in LCDs; 2) As a PV device, the ZOPV film harvests the EM wave component parallel to the molecular chain orientation (p-mode polarized light, which is absorbed and wasted in a conventional LCD), converting it into electricity; 3) Ambient light or sunlight PV panel. When the ZOPV device is integrated into the LCD panel, its photovoltaic function remains even when the LCD panel is not in use, producing electricity through conversion of photons from ambient light or sun light.

The ZOPV films can be realized by the uniaxial orientation of polymer conjugated molecules. Here, the polymer used is poly(3-hexylthiophene) (P3HT), which is the most popular p-type polymer in organic photovoltaic (OPV) technology. By rubbing a P3HT film with velvet cloth at 150° C. 50 times, polymer chains are oriented along the rubbing direction, resulting in the polarizing P3HT (z-P3HT) film with anisotropic optical properties. After the fabrication of the z-P3HT film, phenyl-$C_{61}$-butyric acid methyl ester ($PC_{60}BM$) is coated sequentially onto z-P3HT film followed by annealing at 150° C. for 5 min. The $PC_{60}BM$ molecules will diffuse into the oriented P3HT matrix and finally provide the P3HT-PCBM quasi-bilayer ZOPV films.

Figures 10A, 10B, 10C, 10D:
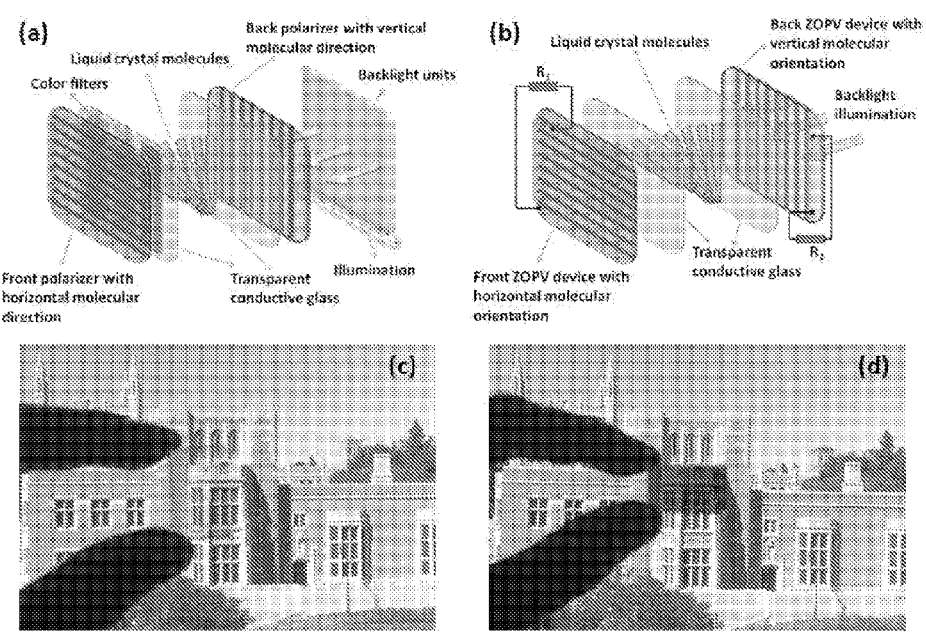
FIGS. 10A-10B show schematic illustrations of LCD (a) and the potential LCD system integrated with ZOPV devices (b).
FIGS. 10C-10D show Z-P3HT film with the rubbing direction parallel (c) or perpendicular (d) to the molecular orientation in the analyzer.

FIGS. 10C and 10D compare the anisotropic appearance of z-P3HT film. The pictures were taken by placing a traditional linear polarizer in front of a digital camera and hence provided polarized light. In FIG. 10C, the z-P3HT (analyzer) and the polarizer have parallel (molecular) orientation; therefore, the polarized light can pass through both of them, resulting in a transparent appearance. In FIG. 10D, the z-P3HT film and polarizer are arranged with perpendicular (molecular) orientation. This results in a dark view due to the crossed-polarization by the two polarizers.

The parallel and perpendicular polarizations are defined using the oriented polymer backbone axis as the reference. If the optical polarization is parallel to the polymer backbone, it is parallel polarization (defined as p-mode), and it will be absorbed by the polymer film; if it is perpendicular polarization (defined as s-mode), the light will have minimum absorption in the polymer film.

Figure 1:
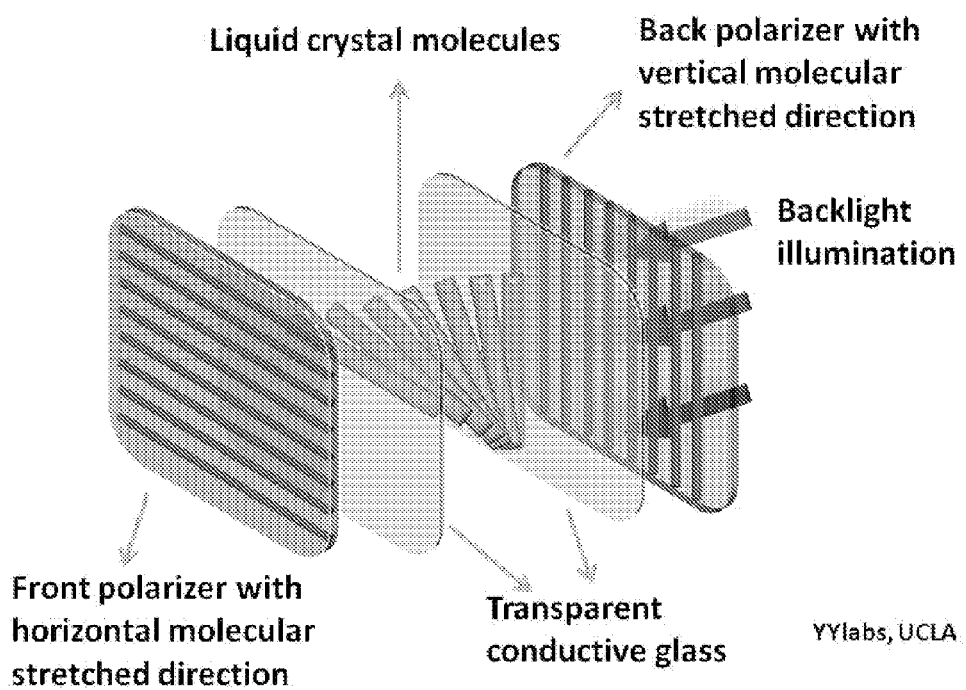
FIG. 1 is a schematic illustration of the basic structure of an LCD display.
Figures 11A, 11B, 11C, 11D:
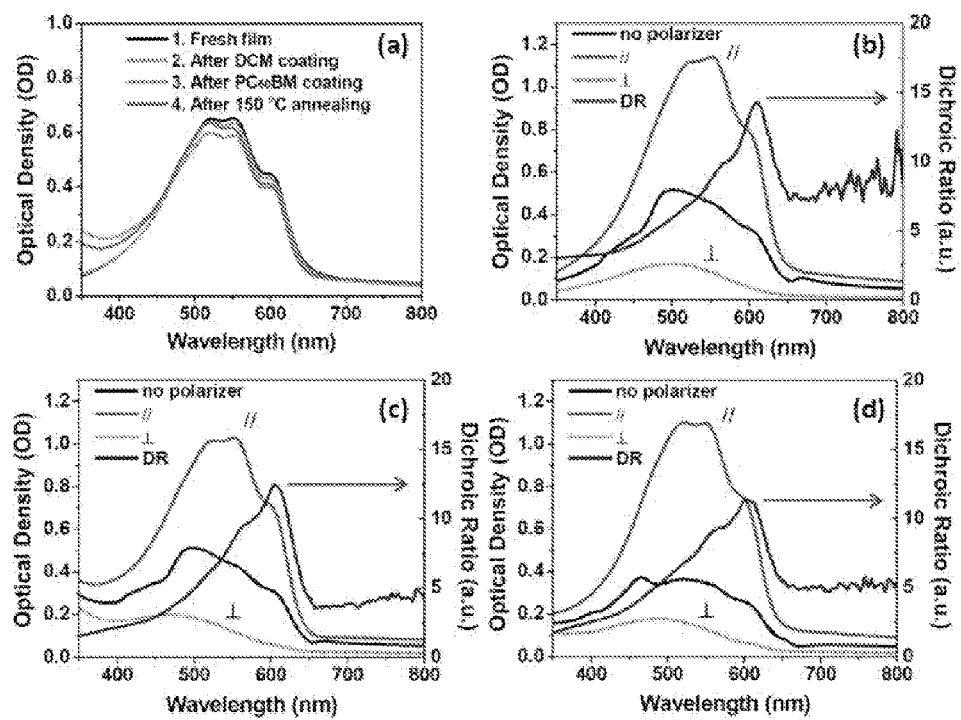
FIGS. 11A-11D show optical data of ZOPV films according to an embodiment of the current invention. (a) Absorption of P3HT films upon different treatments: (1) fresh P3HT film; (2) the P3HT film after spin-drop-coating dichloromethane (DCM) solvent; (3) quasi-bilayer P3HT-PC$_{60}$BM PV film; (4) absorption of the film in (3) after 150° C. thermal annealing for 5 min. (b) Polarized absorption of the z-P3HT films obtained with either s-(⊥) or p-(//) polarized incident light. (c) Polarized absorption of the quasi-bilayer P3HT-PC$_{60}$BM film without annealing. (d) Polarized absorption of the quasi-bilayer P3HT-PC$_{60}$BM film in (c) after annealing at 150° C. for 5 min.

FIGS. 11A-11D show the optical data for the ZOPV films. In FIG. 11A, the absorption of regular P3HT film is studied upon different treatments. Dichloromethane (DCM) is a poor solvent for P3HT. When spin-coating pure DCM onto the P3HT film, no significant difference is observed between FIGS. 11A-1 and -2, indicating the resistance of P3HT film to DCM solvent. When $PC_{60}BM$ is coated onto P3HT from its DCM solution followed by annealing, PCBM molecules will diffuse into the P3HT films to form the interpenetrated quasi-bilayer P3HT-PCBM PV film. From FIGS. 11A-3 and -4, it is clear that the diffusion of PCBM molecules won't affect the absorption of P3HT films. The absorption shoulder around 600 nm, which indicates the packing of P3HT chains, is not changed after thermal annealing. This suggests that the PCBM molecules only move in the disordered regions of P3HT film, but won't affect the ordered packing of P3HT chains. FIG. 11B shows the polarized absorption of the z-P3HT film to s- and p-polarized incident light. Under the s-polarized light, the optical density at 610 nm is only 0.0494 OD. In contrast, when the absorption is taken under p-polarized light, much stronger optical density of 0.705 OD is observed at 610 nm. The ratio between absorption for p- and s-polarized light (defined as the dichroic ratio, DR) can reach up to 14.3. This suggests the highly efficient molecular alignment induced by the surface rubbing process. FIG. 11C shows the polarized absorption of the quasi-bilayer P3HT-$PC_{60}BM$ ZOPV film without annealing treatment. The DR peaks at 604 nm with a high value of ~12.4. This indicates that P3HT molecular chains still keep the high orientation after the coating of $PC_{60}BM$. More importantly, $PC_{60}BM$ has weak absorption in the visible range and this won't affect the final anisotropic absorption of the ZOPV film by much. After annealing at 150° C. for 5 min, $PC_{60}BM$ molecules will diffuse into the aligned P3HT matrix. From the polarized absorption spectra in FIG. 11D, we note that the final ZOPV film still has a high DR ratio of up to 11.3 at 604 nm, indicating that the aligned P3HT molecular chains maintain the high orientation after thermal annealing. From these spectral results, it can be concluded that PCBM molecules won't affect the P3HT molecules orientation and packing when they are diffusing into the aligned P3HT matrix and forming the quasi-bilayer ZOPV films.

Figures 12A, 12B:
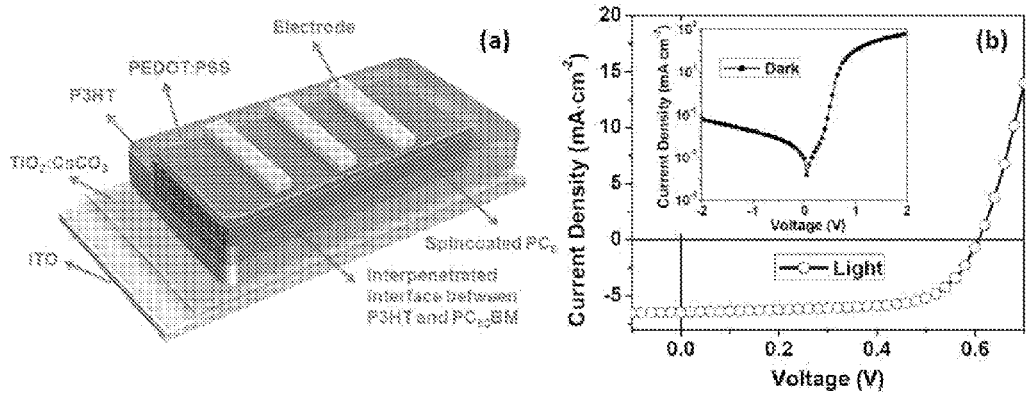
FIGS. 12A-12B provide characterization results for an inverted quasi-bilayer OPV device according to an embodiment of the current invention. (a) Device architecture. (b) J~V characterization. Inset: Dark current.

With the interpenetrated P3HT-$PC_{60}BM$ quasi-bilayer PV film, we fabricate the quasi-bilayer OPV devices using a novel inverted structure. FIG. 12A shows the inverted quasi-bilayer device structure. In this device, the P3HT-$PC_{60}BM$ quasi-bilayer PV film is prepared on the cathode modification layer ($TiO_2$:$CsCO_3$). The anode modification layer, such as poly(3,4-ethylenedioxythiophene)/poly(styrenesulfonate) (PEDOT:PSS), is coated onto the quasi-bilayer PV film. Compared with inverted bulk heterojunction devices and regular quasi-bilayer devices, the inverted quasi-bilayer device architecture has some particular advances for ZOPV purpose. On one hand, the P3HT donor and $PC_{60}BM$ acceptor can be processed separately. This provides feasibility to fabricate the polymer donor films with other functions, such as the anisotropic optical property. On the other hand, the mechanical rubbing process on P3HT film may create scratches. These scratches will lead to a short circuit when depositing the back electrode. The inverted structure provides an efficacious solution for this mechanical problem. Anode interfacial modification layers, such as PEDOT:PSS, can form a surface sealing layer to prevent the direct contact between cathode and anode. FIG. 12B gives the current density versus voltage (J-V) characterization of the inverted quasi-bilayer PV devices based on the regular P3HT film (control device). The measurement is performed under regular AM1.5 G 1 Sun irradiation. A power conversion efficiency ($\eta_e$) of 2.62% is obtained with a short-circuit current ($J_{sc}$) of 6.45 mA·cm$^{-1}$, an open-circuit voltage ($V_{oc}$) of 0.61 V and fill factor (FF) of 66.6%. It should be noted that, in this device architecture, the p-type P3HT layer is directly coated onto the n-type $TiO_2$:$CsCO_3$ interface modification layer, while the p-type PEDOT:PSS layer is coated on the top of n-type $PC_{60}BM$ acceptor. Judging from the device structure, it seems that the n-type P3HT bottom layer might block the electron collection from $PC_{60}BM$. However, as we know from recently reports, the $PC_{60}BM$ molecules will diffuse into the P3HT matrix. The good device performance above provides evidence for such diffusion. Moreover, it can also be concluded that $PC_{60}BM$ molecules not only diffuse into the P3HT film, but also reach the bottom n-type interface modification layer, providing transport routes for efficient electron collection. Similarly, on the top surface of quasi-bilayer film, the thermal induced $PC_{60}BM$ diffusion also helps to expose more P3HT component to the PEDOT:PSS layer and this ensure the efficient hole collection at the back electrode.

Based on the inverted quasi-bilayer device architecture, we fabricated ZOPV devices using z-P3HT film. Both the reflective electrode (Al, 100 nm, FIG. 13A) and transparent electrode (Au, 10 nm, FIG. 13B) are used for the devices. Table 1 summarizes the device performances. The devices are tested under both the unpolarized and polarized AM1.5G illumination. When tested under unpolarized AM1.5G 1 Sun condition, the ZOPV devices with reflective Al electrode reaches a power conversion efficiency of $\eta_e$=1.38%, with $J_{sc}$=3.69 mA·cm$^{-1}$, $V_{oc}$=0.60 V, and FF=62.2%. Compared with the control device using regular P3HT film (Table 1), the low $J_{sc}$ in the ZOPV device is because only the p-portion of the incident light can be efficiently absorbed and transferred into electricity. The ZOPV with transparent Au electrode gives a $\eta_e$=0.69%, with $J_{sc}$=2.74 mA·cm$^{-1}$, $V_{oc}$=0.60 V, and FF=42.2%. These results confirm that the PEDOT:PSS layer apparently provides an effective sealing layer and prevents a short circuit. The low FF for the transparent ZOPV device is primarily because of the high series resistant of the 10 nm Au electrodes on the PEDOT:PSS film.

TABLE 1

Device performance summary.

| Anode | Device type | Test condition | $J_{sc}$ (mA · cm$^{-2}$) | $V_{oc}$ (V) | FF (%) | Eff (%) |
|---|---|---|---|---|---|---|
| Reflective electrode, PEDOT:PSS/Al (100 nm) | Control | AM1.5G, 1 Sun, unpolarized light | 6.45 | 0.61 | 66.6 | 2.62 |
| | ZOPV | AM1.5G, 1 Sun, unpolarized light | 3.69 | 0.60 | 62.2 | 1.38 |
| | ZOPV | s-mode polarized light, 0.33 Sun, ⊥ | 0.68 | 0.53 | 58.5 | 0.63 |
| | ZOPV | p-mode polarized light, 0.33 Sun, // | 1.88 | 0.57 | 62.2 | 2.00 |
| Transparent electrode, PEDOT:PSS/Au (10 nm) | ZOPV | AM1.5G, 1 Sun, unpolarized light | 2.74 | 0.60 | 42.2 | 0.69 |
| | ZOPV | s-mode polarized light, 0.33 Sun, ⊥ | 0.41 | 0.51 | 53.1 | 0.33 |
| | ZOPV | p-mode polarized light, 0.33 Sun, // | 1.45 | 0.57 | 50.3 | 1.25 |

Figures 13A, 13B, 13C, 13D:
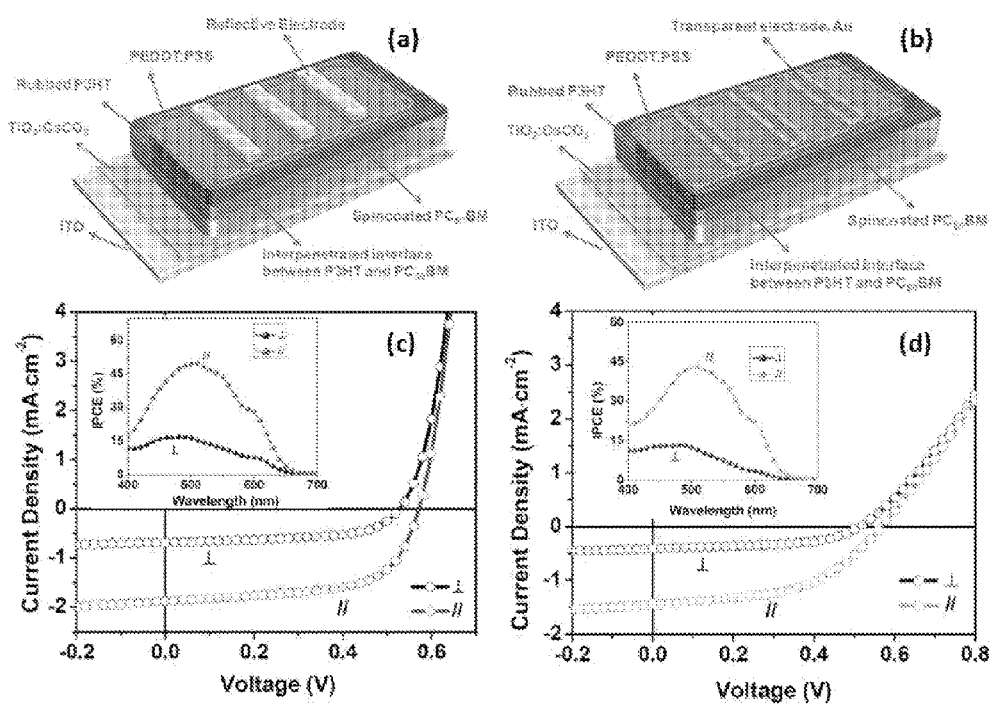
FIGS. 13A-13D show an inverted quasi-bilayer ZOPV device architecture using reflective Al electrode (a) or transparent Au electrode (b) according to an embodiment of the current invention. Dichroic J~V Characterization of the inverted quasi-bilayer ZOPV devices with reflective (c) and transparent (d) electrodes. Inset: polarizing IPCE spectra.

In the polarizing PV performance characterization of ZOPV devices, a polarizer is placed between devices and light source to provide polarized incident light. The polarized light intensity is ~33 mW·cm$^{-1}$. FIG. 13C shows the dichroic photovoltaic effect of a ZOPV device with reflective electrode. The reflective ZOPV device generates a $J_{sc}$ of 1.88 mA·cm$^{-1}$ under p-mode polarized light, with a $\eta_e$=2.00%, $V_{oc}$=0.57 V, and FF=62.2%. In contrast, when tested under s-mode polarized light, the $J_{sc}$ is only 0.68 mA·cm$^{-1}$, with a $\eta_e$=0.64%, $V_{oc}$=0.528 V, and FF=58.53%. The ratio of $J_{sc}$(p) to $J_{sc}$(s) is 2.76. Polarized incident photo-to-current conversion efficiency (IPCE) is also utilized to identify the polarized $J_{sc}$, which gives a $J_{sc}$(p)=1.92 mA·cm$^{-1}$, $J_{sc}$(s)=0.71 mA·cm$^{-1}$ and a $J_{sc}$ ratio of 2.70. FIG. 13D shows the polarized J-V characterization of the transparent ZOPV device. A higher $J_{sc}$ ratio of up to 3.54 is achieved with $J_{sc}$(p)=1.45 mA·cm$^{-1}$, and $J_{sc}$(s)=0.41 mA·cm$^{-1}$. Compared with the ratio in the reflective electrode, this ratio is a little higher. This is because the incident light in the reflective ZOPV is reflected by the electrode, causing the incident light to propagate through the active layer twice and be absorbed twice. For the transparent ZOPV, the incident light is not reflected and only absorbed once.

In this example of some applications, we develop the ZOPV technology, a novel concept of energy harvesting and recycling technology. We have successfully achieved the highly oriented P3HT films with high DR values of up to 14.3 through a surface rubbing method. A novel inverted quasi-bilayer ZOPV device based on the oriented P3HT film is described. Good device performance has demonstrated that the PC$_{60}$BM molecules will penetrate through the highly aligned P3HT matrix and reach the bottom electrode while maintaining the orientation of P3HT chains. Dichroic photovoltaic effect characterization has given a high $J_{sc}$ ratio of 3.54. At a value >10%, it shows high promise of revolutionizing the architecture of the traditional LCD display. This method of both recycling otherwise wasted energy and harvesting the outside light energy can be significant towards the development of a green technology.

Methods

Materials.

Poly(3-hexylthiophene) (P3HT) was purchased from Rieke Metals, Inc. [6,6]-phenyl C$_{61}$-butyric acid methyl ester (PC$_{60}$BM) was purchased from Nano-C. Poly(3,4-ethylenedioxythiophene)/poly(styrenesulfonate) (PEDOT:PSS, CLEVIOS™ P VP Al 4083) was purchased from H.C. Starck. All materials were used as received.

Polarizing P3HT (z-P3HT) Film Fabrication.

The solution of P3HT in chlorobenzene (2 wt %) was spin-drop-cast onto substrate at a speed of 2500 rpm for 5 s. The film was then annealed at 150° C. for 10 min. The P3HT film was rubbed slightly with a velvet cloth 50 times at 150° C.

Inverted Quasi-Bilayer Device Fabrication.

The devices were fabricated on indium tin oxide (ITO) coated glass substrates with a sheet resistance of 15 Ω·square$^{-1}$. TiO$_2$:CsCO$_3$ solution prepared by blending 0.4 and 0.4 wt % solutions of TiO$_2$ and Cs$_2$CO$_3$ in a 1:1 volume ratio was spin-casted at 2500 rpm for 30 s, and the thermal annealing was performed at 150° C. for 20 min. The P3HT films (regular or polarizing films) were fabricated over the TiO$_2$:CsCO$_3$ layer. A 0.5 wt % solution of PC$_{60}$BM in dichloromethane was spin-drop-coated onto the P3HT film while the substrate was spinning at 4500 rpm. The films were then annealed at 150° C. for 2~10 min to form the quasi-bilayer structure. Then, PEDOT:PSS with surfactants was spin-coated at 4000 rpm for 60 s and annealed at 80° C. for 5 min. The device fabrication was completed by thermal evaporation of Al (100 nm) as the reflective electrode or Au (10 nm) as the transparent electrode under vacuum at a base pressure of 2×10$^{-6}$ Torr.

Electrical, Optical and Microscopic Characterization of Photovoltaic Cells and Thin Films.

Absorption spectra were taken using a Hitachi ultraviolet-visible spectrophotometer (U-4100). For the polarized absorption characterization, a prism polarizer accessory was placed between the light source and the samples to provide the polarized incident light. J-V characteristics of photovoltaic cells were taken using a Keithley 2400 source unit under a simulated AM1.5G spectrum with an Oriel 91191 solar simulator. For the polarizing PV measurement, a polarizer was placed between the light source and device to provide the polarized incident light. The intensity of the polarized light is ~33 mW·cm$^{-2}$, which is calculated using a Si photodiode.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. An electro-optic device, comprising:
    a first electrode;
    a second electrode spaced apart from said first electrode; and
    an active layer of organic semiconducting material between said first electrode and said second electrode,
    wherein said active layer comprises a quasi-bilayer in which a first plurality molecules from a first layer of active material is interpenetrated by a second plurality of molecules from a second layer of active material formed on said first layer, said first and second pluralities of molecules providing donor-acceptor pairs such that said quasi-bilayer has at least a portion that is a bulk heterojunction active layer, and
    wherein each of said first plurality of molecules has a long axis that is longer than corresponding transverse axes and said long axis is substantially aligned along a common direction such that said active layer is more sensitive to a first polarization of incident light than a second polarization of said incident light, said first polarization and said second polarization being orthogonal polarization components of said light.

2. An electro-optic device according to claim 1, wherein said active layer is more sensitive to said first polarization than said second polarization of said incident light by a ratio of at least 6.

3. An electro-optic device according to claim 1, wherein said active layer is more sensitive to said first polarization than said second polarization of said incident light by a ratio of at least 10.

4. An electro-optic device according to claim 1, wherein said active layer is more sensitive to said first polarization than said second polarization of said incident light by a ratio of at least 14.

5. An electro-optic device according to claim 1, wherein said quasi-bilayer comprises a polymer.

6. An electro-optic device according to claim 1, wherein at least one of said first and second electrodes is substantially transparent at an operating wavelength.

7. An electro-optic device according to claim 1, further comprising:
    a transparent substrate upon which said first electrode is formed, said first electrode being substantially transparent at an operating wavelength; and
    a buffer layer of n-type material formed on said first electrode,
    wherein said first layer of said quasi-bilayer is a p-type polymer donor material formed on said buffer layer such that said electro-optic device is an inverted photovoltaic polarizer.

8. An electro-optic device according to claim 1, further comprising:
    a transparent substrate upon which said first electrode is formed, said first electrode being substantially transparent at an operating wavelength; and
    a buffer layer of p-type material formed on said first electrode,
    wherein said first layer of said quasi-bilayer is an n-type polymer donor material formed on said buffer layer.

9. An electro-optic device according to claim 1, further comprising:
    a second active layer of organic semiconducting material between said first electrode and said second electrode,
    wherein said second active layer comprises a second quasi-bilayer in which a third plurality molecules from a third layer of active material is interpenetrated by a fourth plurality of molecules from a fourth layer of active material formed on said third layer, said third and fourth pluralities of molecules providing donor-acceptor pairs such that said second quasi-bilayer has at least a portion that is a second bulk heterojunction active layer, and
    wherein each of said second plurality of molecules has a long axis that is longer than corresponding transverse axes and said long axis is substantially aligned along a common direction such that said second active layer is more sensitive to said second polarization of said incident light than said first polarization of said incident light.

10. A method of producing a polarization-sensitive photovoltaic device, comprising:
    forming a layer of first active material on a substructure, said substructure comprising a first electrode, wherein said first active material comprises a first plurality of molecules each having a long axis that is longer than corresponding transverse axes;
    aligning said long axes of said first plurality of molecules substantially along a common direction;
    forming a layer of a second active material on said layer of said first active material after said aligning, said second active material comprising a second plurality of molecules;
    forming a quasi-bilayer from said layers of said first and second active materials such that said second plurality of molecules interpenetrate said layer of said first active material, said first and second pluralities of molecules providing donor-acceptor pairs such that said quasi-bilayer has at least a portion that is a bulk heterojunction active layer; and
    forming a second electrode in electrical connection with said quasi-bilayer.

11. A method of producing a polarization-sensitive photovoltaic device according to claim 10, wherein said aligning said long axes of said first plurality of molecules comprises rubbing said layer of first active material in a preselected direction to cause said alignment.

12. A method of producing a polarization-sensitive photovoltaic device according to claim 10, wherein said forming said quasi-bilayer comprising an annealing process.

13. A liquid crystal display, comprising:
    a first polarizer;
    a second polarizer spaced apart from said first polarizer; and an electrically controllable liquid crystal element arranged between said first and said second polarizers, wherein said first and second polarizers are arranged in a substantially cross-polarized orientation with respect to each other, and wherein at least one of said first and second polarizers is a photovoltaic polarizer that is more sensitive to a first polarization of incident light than a second polarization of said incident light.

14. A liquid crystal display according to claim 13, wherein said at least one of said first and second polarizers comprises:

a first electrode;

a second electrode spaced apart from said first electrode; and an active layer of organic semiconducting material between said first electrode and said second electrode, wherein said active layer comprises a quasi-bilayer in which a first plurality molecules from a first layer of active material is interpenetrated by a second plurality of molecules from a second layer of active material formed on said first layer, said first and second pluralities of molecules providing donor-acceptor pairs such that said quasi-bilayer has at least a portion that is a bulk heterojunction active layer, and wherein each of said first plurality of molecules has a long axis that is longer than corresponding transverse axes and said long axis is substantially aligned along a common direction such that said active layer is more sensitive to a first polarization of incident light than a second polarization of said incident light, said first polarization and said second polarization being orthogonal polarization components of said light.

15. A liquid crystal display according to claim 14, wherein said active layer is more sensitive to said first polarization than said second polarization of said incident light by a ratio of at least 6.

16. A liquid crystal display according to claim 14, wherein said active layer is more sensitive to said first polarization than said second polarization of said incident light by a ratio of at least 10.

17. A liquid crystal display according to claim 14, wherein said active layer is more sensitive to said first polarization than said second polarization of said incident light by a ratio of at least 14.

18. A liquid crystal display according to claim 14, wherein said quasi-bilayer comprises a polymer.

19. A liquid crystal display according to claim 14, wherein at least one of said first and second electrodes is substantially transparent at an operating wavelength.

20. A liquid crystal display according to claim 14, further comprising:

a transparent substrate upon which said first electrode in formed, said first electrode being substantially transparent at an operating wavelength; and a buffer layer of n-type material formed on said first electrode, wherein said first layer of said quasi-bilayer is a p-type polymer donor material formed on said buffer layer such that said electro-optic device is an inverted photovoltaic polarizer.

21. A liquid crystal display according to claim 14, further comprising:

a transparent substrate upon which said first electrode is formed, said first electrode being substantially transparent at an operating wavelength; and a buffer layer of p-type material formed on said first electrode, wherein said first layer of said quasi-bilayer is an n-type polymer donor material formed on said buffer layer.

* * * * *